United States Patent

Yanagawa

[15] 3,663,872

[45] May 16, 1972

[54] INTEGRATED CIRCUIT LATERAL TRANSISTOR

[72] Inventor: Takayuki Yanagawa, Tokyo, Japan

[73] Assignee: Nippon Electric Co., Ltd., Tokyo, Japan

[22] Filed: Jan. 19, 1970

[21] Appl. No.: 3,773

[30] Foreign Application Priority Data

Jan. 22, 1969 Japan....................................44/4928

[52] U.S. Cl.....................317/235 R, 317/235 E, 317/235 F, 317/235 Y, 317/235 AM, 148/175

[51] Int. Cl.........................................................H01l 11/06

[58] Field of Search...........................317/235; 307/303, 299

[56] References Cited

UNITED STATES PATENTS 3,284,723 11/1966 Henkels................................317/235

3,299,281 1/1967 Cluwen................................317/235

FOREIGN PATENTS OR APPLICATIONS 441,512 1/1968 Switzerland..........................317/235

OTHER PUBLICATIONS

IBM Tech. Discl. Bul. " Light Activated Semiconductor Switch," Pieczonka, Vol. 7, No. 7, Dec. 1964 pp. 618–619.

*Primary Examiner*—Jerry D. Craig

*Attorney*—Sandoe, Hopgood & Calimafde

[57] ABSTRACT

A lateral transistor serving as a minority transistor in an integrated circuit has a region buried in the base region and having an opposite conduction type to the base region.

4 Claims, 7 Drawing Figures

INVENTOR
Takayuki Yanagawa
by
Sandoe, Hopgood & Calimafde
ATTORNEYS

INVENTOR
Takayuki Yanagawa
by
Sandoe, Hopgood & Calimafde
ATTORNEYS

INTEGRATED CIRCUIT LATERAL TRANSISTOR

This invention relates generally to planar transistors, and more particularly to lateral transistors used as parts of semiconductor integrated circuits.

In a semiconductor integrated circuit, various circuit elements such as diodes, transistors, resistors, and the like are isolated from one another and arranged with high density in a small semiconductor single crystal chip. A PN-junction, silicon oxide film, or the like has hitherto been used for the insulation layer. Each circuit element is fabricated simultaneously through selective diffusions of impurities. Usually, these diffusion processes are designed mainly for fabricating the base and emitter regions of transistors, and other circuit elements such as diodes and resistors are fabricated by utilizing part or whole of these diffusion processes. Accordingly, although uniform characteristics can be obtained for each circuit element, it has heretofore been difficult to obtain such an integrated circuit in a single chip having elements of quite different properties or performance characteristics. Hence, the versatility in circuit design is greatly reduced in an integrated circuit, as compared to the design of circuits having conventional discrete elements.

A distinctive feature of the transistor circuit as compared to the vacuum tube circuit, lies in the fact that two kinds of active elements with different polarities, to wit, NPN- and PNP-transistors, are available and can be incorporated into a circuit so that the design versatility can be increased. In a semiconductor integrated circuit based on a transistor circuit, it may be required to incorporate both NPN- and PNP-transistors into a semiconductor single crystal chip. However, it is very difficult due to restrictions in the fabricating process to incorporate both NPN- and PNP-transistors into a single semiconductor chip.

The conventional semiconductor integrated circuit is composed mainly of NPN-transistors and, accordingly, it has heretofore been difficult to fabricate PNP-transistors therein. Also, it has been difficult to realize NPN-transistors in an integrated circuit constituted mainly of PNP-transistors. Either the PNP- or NPN-transistor which serves as the majority of transistors in an integrated circuit will hereinafter be called the "majority transistor."

Various arrangements have been proposed to fabricate a PNP-transistor as the minority transistor in an integrated circuit. One typical minority PNP-transistor is the lateral transistor, a sectional view of which is shown in FIG. 1. This transistor is formed in a manner such that P-type diffusion layers 1 and 2 are formed adjacent to each other in a N-type epitaxial layer 3. These layers are formed in a diffusion process in which the base region of the majority NPN-transistor (not shown herein diagramatically is formed. One of the diffusion layers, for example, layer 1, is used as the emitter of the PNP-transistor; the other layer 2, as the collector; and N-type epitaxial layer 3, as the base. According to this method, there is no increase in the number of steps in the fabricating process since the minority PNP-transistor can be formed during the process of fabricating the majority transistor. The PNP-transistor is isolated from the other circuit elements by the reverse-biased PN-junction located between the N-type base region 3 and the P-type substrate 4 which is maintained at the minimum potential in the completed circuit. As a result, this lateral PNP-transistor is compatible with the other circuit elements. As for the operation of this lateral transistor, the minority carriers (positive hole) P and Q injected into the base layer 3 from the emitter layer 1 may not all be captured by the collector layer 2; namely only carriers Q which are injected therein from the surface opposite to the collector contribute to the transistor operation.

FIG. 1 is a schematic representation of the structure wherein the longitudinal length (or depth) is exaggerated. In the actual diffusion layer it is difficult to provide a ratio of the lateral length to depth of less than 10. Therefore it has been impossible to obtain sufficient current gain in this lateral transistor. If the distance between the emitter layer 1 and the collector layer 2, which corresponds to the base width, is reduced in order to increase the current gain, the collector depletion layer reaches the emitter layer 1 at a relatively low reverse collector bias and, as a result, the sustained voltage between the collector and emitter is lowered. Moreover, in this lateral transistor, the base resistance cannot be reduced because the base electrode 5 may not be installed between the emitter layer 1 and collector layer 2.

It is an object of this invention to provide an improved transistor structure in connection with a semiconductor integrated circuit in which the lateral transistor serves as the minority transistor.

The transistor according to this invention is characterized in that it has a region (which is hereinafter referred to as the "buried region") whose conduction type is opposite to that of the base region. The buried region is buried in the base region at a portion below the emitter and collector regions formed by diffusion from the surface of the base region.

The transistor of this invention may be considered as a complex transistor comprising a first transistor part in which the emitter region, base region, and buried region whose conduction type is opposite to that of the base region, are used as the emitter, base and collector respectively, and a second transistor part in which the buried region, base region and collector region are used as the emitter, base and collector respectively.

With respect to the operation of the transistor according to this invention, most of the minority carriers injected thereinto from the emitter travel across the base region and are captured by the buried region which serves as the collector of the first transistor part. The collector of the first transistor part is practically in the open state, and is therefore quickly saturated. In a transistor which is in the saturated state, an excess current to the collector load is reinjected into the base. Since the buried layer is in the open state, the entire current captured by the collector of the first transistor part is reinjected into the base region. This injected carrier flows as the emitter current in the second transistor, travels across the base region, and is captured by the collector region since the collector in the first transistor part serves as the emitter in the second transistor part. Thus, the behavior of the emitter, base, and collector which are exposed to the exterior reflect the operation of the minority transistor.

In the transistor of this invention, the emitter has its effective junction face not on the side wall but on the whole of the wide bottom area, in contrast to the conventional lateral transistor, so that it is possible to increase the current gain of the transistor. Since it is not necessary to locate the emitter and collector regions close to one another, the sustained voltage between the collector and emitter can be increased to nearly that between the collector and base, and furthermore, the base electrode can be disposed completely around the emitter if desired, and thus the base resistance can be reduced.

As described above, the invention permits several useful improvements on the conventional lateral transistor without impairing the advantages inherent to the relevant prior art in view of the fact that the transistor of this invention can be isolated from the other circuit elements in an integrated circuit and compatible with other transistors in that circuit.

To the accomplishment of the above and to such further objects as may hereinafter appear, the present invention relates to an integrated circuit lateral transistor substantially as defined in the appended claims, and as described in the following specification taken together with the accompanying drawings in which:

Figure 1:
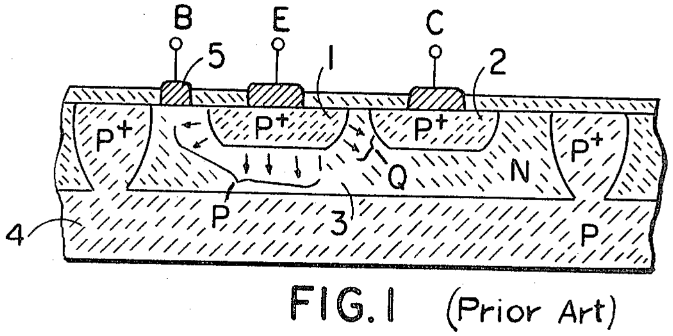
FIG. 1 (Prior Art)
FIG. 1 is a sectional view showing a PNP-transistor used in a conventional integrated circuit.
Figure 2:
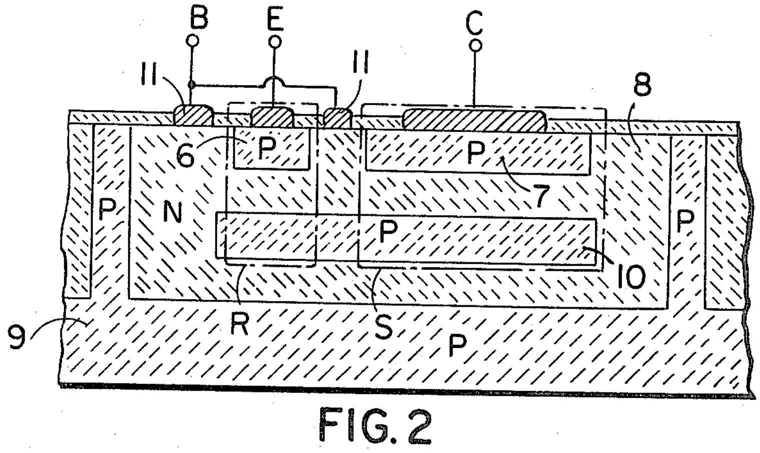
FIG. 2 is a sectional view showing an arrangement in which a transistor of this invention is formed in an integrated circuit.

FIG. 2 is a sectional view showing schematically a lateral PNP-transistor of this invention, which is formed in a semiconductor integrated circuit incorporating a majority NPN-transistor. An emitter region 6 and a collector region 7 are formed in the same manner as described with respect to the transistor shown in FIG. 1. One of the features of this invention is that the transistor has a P-type region 10 which is isolated from the emitter and collector regions 6 and 7 and also from the substrate 9 at the portion below the emitter and collector regions 6 and 7. Moreover, region 10 is completely enclosed within the base region 8. As described above, this P-type region 10 which is the "buried region" referred to previously, serves to collect the positive holes injected into the base region 8 from the emitter region 6 and to reinject them into the collector region 7. In FIG. 2, the left hand portion R enclosed by the broken line operates as a first transistor part, and the portion S on the right hand of the Figure serves as the second transistor part. This arrangement is expressed by the equivalent circuit of FIG. 3.

In order to effectively capture the carriers reinjected into the base region 8 from the buried region 10, it is desirable that the area of the collector region 7 be made of a size as equal to that of the buried region 10 as possible. The reason for showing the collector region 7 larger than the emitter region 6 in FIG. 2 is to illustrate the effect of this arrangement. FIG. 2 also illustrates that a base electrode 11 is disposed on both sides of the emitter region 6, or the base electrode 11 may be concentrically arranged around the emitter electrode, to thereby reduce the base resistance. Needless to say, the transistor structure shown in FIG. 2 can be readily fabricated by an existing manufacturing technique such as a vapor growth technique, a combination of vapor growth and diffusion techniques, or the like.

Figures 3, 4:
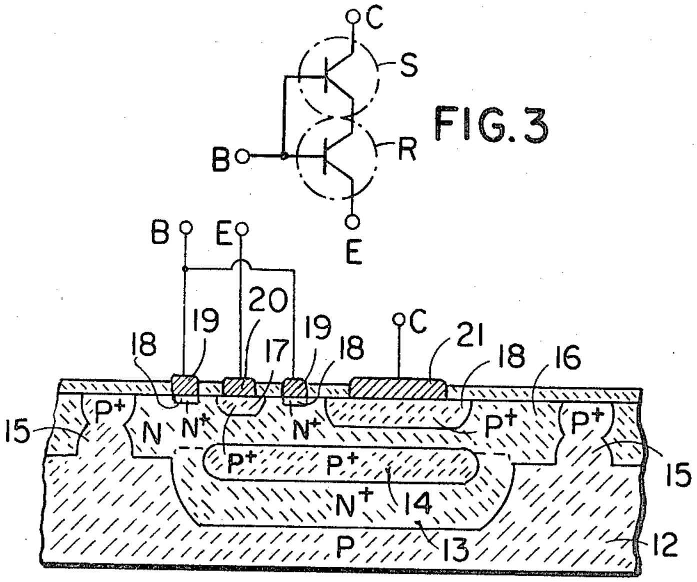
FIG. 3 is an electrical equivalent circuit diagram of the arrangement shown in FIG. 2.
FIG. 4 is a sectional diagram showing another embodiment of this invention.
Figure 5:
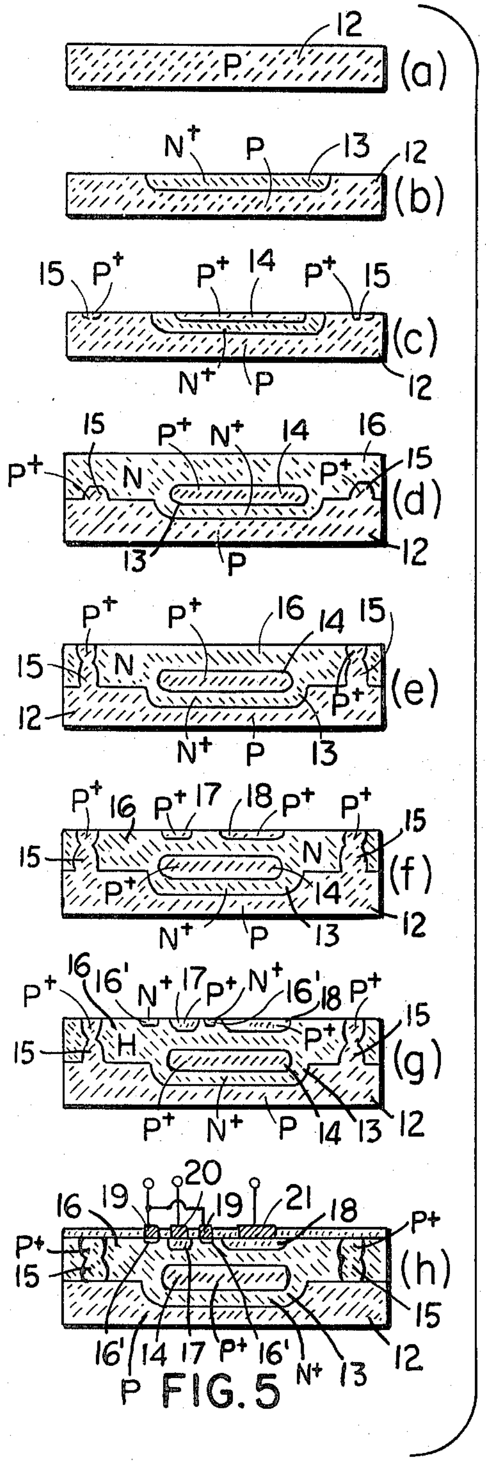
FIGS. 5a–5h are sectional diagrams showing in sequence the steps of a process for producing the transistor of FIG. 4.

FIG. 4 shows a lateral transistor embodying this invention, which is fabricated according to a method suited for the fabrication of a conventional majority NPN-transistor, and FIG. 5 shows in sequence the steps of the process for fabricating this transistor. FIG. 5a is a sectional view showing a P-type substrate 12 on which the desired integrated circuit is to be formed. An N-type impurity is diffused into substrate 12 from one of its surfaces whereby an N-type diffusion layer 13 is formed, as shown in FIG. 5b. A P-type diffusion layer 14 is then formed in the N-type diffusion layer 13, as shown in FIG. 5c. At the same time, a P-type diffusion layer 15 may be formed surrounding the N-type diffusion layer 13. Diffusion layer 15 is used to isolate the PNP transistor from the other circuit elements in the integrated circuit. As shown in FIG. 5d, and N-type epitaxial layer 16 may then be formed on the surface of the substrate. In this step, the diffusion layers 13, 14, and 15 in the substrate 12 may be diffused into the epitaxial layer 16. In this step and in the succeeding step, the P-type diffusion layer 14 must be buried in the N-type region or be enclosed in the N-type region. For this reason, it is necessary to deeply diffuse the N-type diffusion layer 13 into the P-type substrate 12 beforehand. It is also important that the P-type diffusion layer 14 be diffused into the epitaxial layer at a sufficiently higher speed than that at which the N-type diffusion layer 13 is diffused into the epitaxial layer. Use of arsenic or antimony as the N-type impurity, and use of boron as the P-type impurity are recommended for this purpose. Then, as shown in FIG. 5e, a P-type impurity is diffused into the epitaxial layer 16 at the part corresponding to the P-type diffusion layer 15 which surrounds the N-type diffusion layer 13, until this new P-type impurity reaches the P-type diffusion layer 15. By this arrangement, N-type region 16 is isolated from the other regions on which other circuit elements of the integrated circuit may be formed.

As shown in FIG. 5f, a P-type impurity is then diffused in the portion of the N-type region 16 which is located above the P-type diffusion layer 14 to thereby form an emitter region 17 and a collector region 18. As shown in FIG. 5g, an N-type impurity is then diffused around the emitter region 17 whereby a region 16′ having an N-type impurity of high concentration is formed. The aim of region 16′ is to reduce the contact resistance of an electrode 19 attached to the base region 16. Then, as shown in FIG. 5h, the electrodes 20, 19, and 21 are respectively attached to the emitter, base and collector regions 17, 16, and 18.

In comparison with the prior art, the production of a lateral transistor of this invention requires only one additional process step in which, as shown in FIG. 5c, a P-type diffusion layer 14 is disposed in the N-type diffusion layer 13. Practically, this process is simple, since the P-type diffusion layer 14 is formed simultaneously with the forming of the P-type isolation layer 15. The P-type impurity diffusion shown in FIG. 5f, and the N-type impurity diffusion shown in FIG. 5g can be done simultaneously with the base and emitter diffusion process for the majority NPN-transistor (not shown herein).

In the transistor structure shown in FIG. 4, the carrier from the P-type buried layer 14 is reinjected mainly into the surface facing the collector region 18, because the impurity concentration of the N-type layer 13 located below the buried layer 14 is higher than that of the base region 16 located above the N-type layer 13. Generally, the forward voltage at the PN-junction in the layer whose impurity concentration is low, is lower than that in the layer whose impurity concentration is high, and the current injected from the PN-junction is an exponential function of the voltage applied thereto and, therefore, a small voltage variation results in a relatively large current variation.

In the foregoing embodiment, the PN-junction is utilized for isolating the circuit elements from one another. Needless to say, the invention can be applied to circuits utilizing other isolation techniques.

Figure 6:
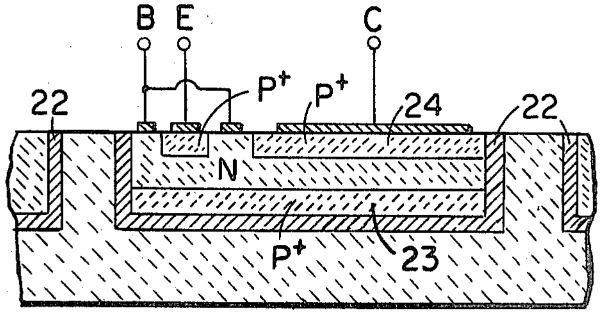
FIGS. 6 and 7 are sectional diagrams showing transistors according to other embodiments of the invention.

FIG. 6 illustrates another embodiment of the invention in which a silicon oxide layer 22 is used to isolate certain circuit elements from one another, and a lateral PNP-transistor is formed in an integrated circuit. The bottom surface of the P-type "buried layer" 23 is in contact with the insulation layer 22 which has portions extending to the surface of the substrate. As a result, the carrier is reinjected from this region toward the portion where a collector diffusion layer 24 is located.

Figure 7:
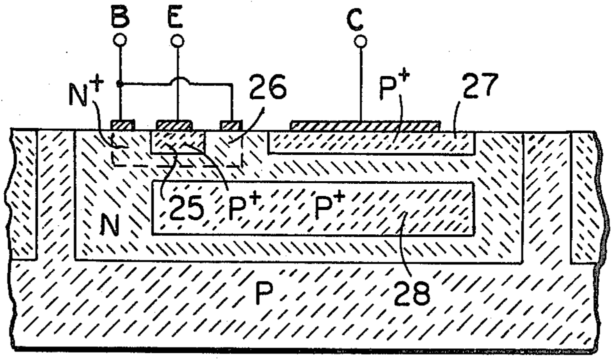

FIG. 7 illustrates yet another embodiment of the invention wherein a region 26 is formed by diffusing an N-type impurity so that this impurity surrounds a P-type emitter layer 25, and the thickness of the resultant diffusion layer 26 is thinner than the P-type emitter layer 25. The purpose of N-type diffusion layer 26 is to reduce the base resistance and to form an accelerating field for the minority carrier injected from the emitter. In this structure, layer 26 may be arranged that it also encircles the collector region 27. By virtue of this arrangement, the base width can be accurately controlled in the diffusion of the impurity from the bottom of the P-type buried layer 28.

As a modification of the foregoing embodiment, the base width of the first transistor part may be made different from that of the second transistor part. For example, the base width of the first transistor part may be reduced to a minimum, thereby to increase the current gain.

In the foregoing embodiments, a PNP-transistor is disclosed, although it is evident that the invention is similarly applicable to an NPN-transistor.

While a few specific embodiments of the invention have been described above, it is to be clearly understood that the invention is not limited thereto or thereby.

I claim:

1. A lateral transistor comprising a semiconductor substrate of a first conductivity type, a base region of a second conductivity type opposite to that of said first conductivity type, said base region comprising a low-resistivity region formed in a surface portion of said substrate and a high-resistivity layer formed on said substrate, a buried region of said first conductivity type formed at the interface of said first low-resistivity region and said high-resistivity layer, whereby said buried region is completely surrounded by said base region, emitter and collector regions of said first conductivity type formed in the surface of said base region and overlying but isolated from said buried region, a single base electrode coupled to said base region, and emitter and collector electrodes coupled respectively to said emitter and collector regions.

2. The transistor of claim 1, in which the ends of said buried region are in approximate alignment with the ends of said emitter and collector regions respectively.

3. The transistor of claim 2, further comprising a low-resistivity region of said second conductivity type formed in said base region and surrounding said emitter region.

4. The transistor of claim 1, further comprising a low-resistivity region of said second conductivity type formed in said base region and surrounding said emitter region.

* * * * *